US006487048B1

(12) United States Patent
Dunn

(10) Patent No.: US 6,487,048 B1
(45) Date of Patent: Nov. 26, 2002

(54) CONDUCTIVE COATING OF FLEXIBLE CIRCUITS FOR ILS TRANSMISSION LINES

(75) Inventor: George Anthony Dunn, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 09/618,201

(22) Filed: Jul. 18, 2000

(51) Int. Cl.[7] .............................................. G11B 5/596
(52) U.S. Cl. .................................................. 360/245.9
(58) Field of Search ........................... 360/245.9, 246; 174/36, 104, 115, 117 F, 117 FF

(56) References Cited

U.S. PATENT DOCUMENTS

| | | | |
|---|---|---|---|
| 4,564,723 A | 1/1986 | Lang | 174/36 |
| 4,819,094 A | 4/1989 | Oberg | 360/104 |
| 4,926,007 A * | 5/1990 | Aufderheide et al. | 156/47 |
| 5,608,591 A | 3/1997 | Klaassen | 360/104 |
| 5,717,547 A | 2/1998 | Young | 360/104 |
| 5,737,152 A | 4/1998 | Balakrishnan | 360/104 |
| 5,754,369 A | 5/1998 | Balakrishnan | 360/104 |
| 5,810,094 A | 9/1998 | Kesler et al. | 174/117 |
| 5,812,344 A | 9/1998 | Balakrishnan | 360/104 |
| 5,995,328 A | 11/1999 | Balakrishnan | 360/104 |
| 6,134,075 A * | 10/2000 | Bennin et al. | 360/245.9 |

OTHER PUBLICATIONS

Jul. 1986, IBM Technical Disclosure Bulletin, pp. 679–680, Screened Tape Cable.

* cited by examiner

*Primary Examiner*—Robert S. Tupper
(74) *Attorney, Agent, or Firm*—Lumen Intellectual Property Services, Inc.

(57) ABSTRACT

A flexible cable consists of trace conductors disposed on a first flexible insulating substrate, and a second flexible insulating upper substrate. Holes are placed on one of the substrates to expose the central conductor. The cable is then washed and sputter deposited with a thin gold film of a thickness of about 10 angstroms. Finally, an aluminum layer of thickness of more than 100 angstroms is sputtered over the cable. The aluminum sputter layer is connected to the central conductor and then they are both electrically grounded. A cost-effective method of making such cable to solve the adhesion problem of the aluminum coating in the prior art.

9 Claims, 6 Drawing Sheets

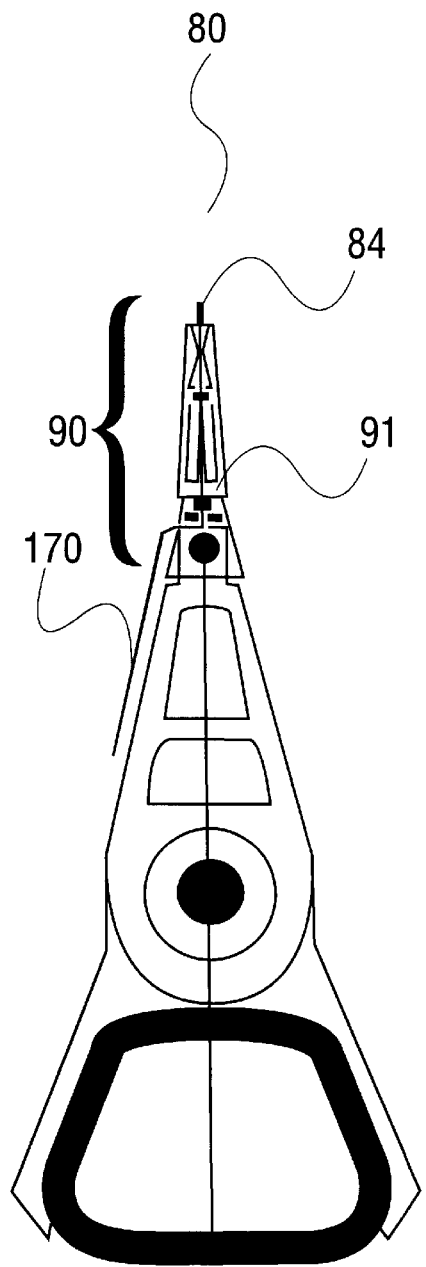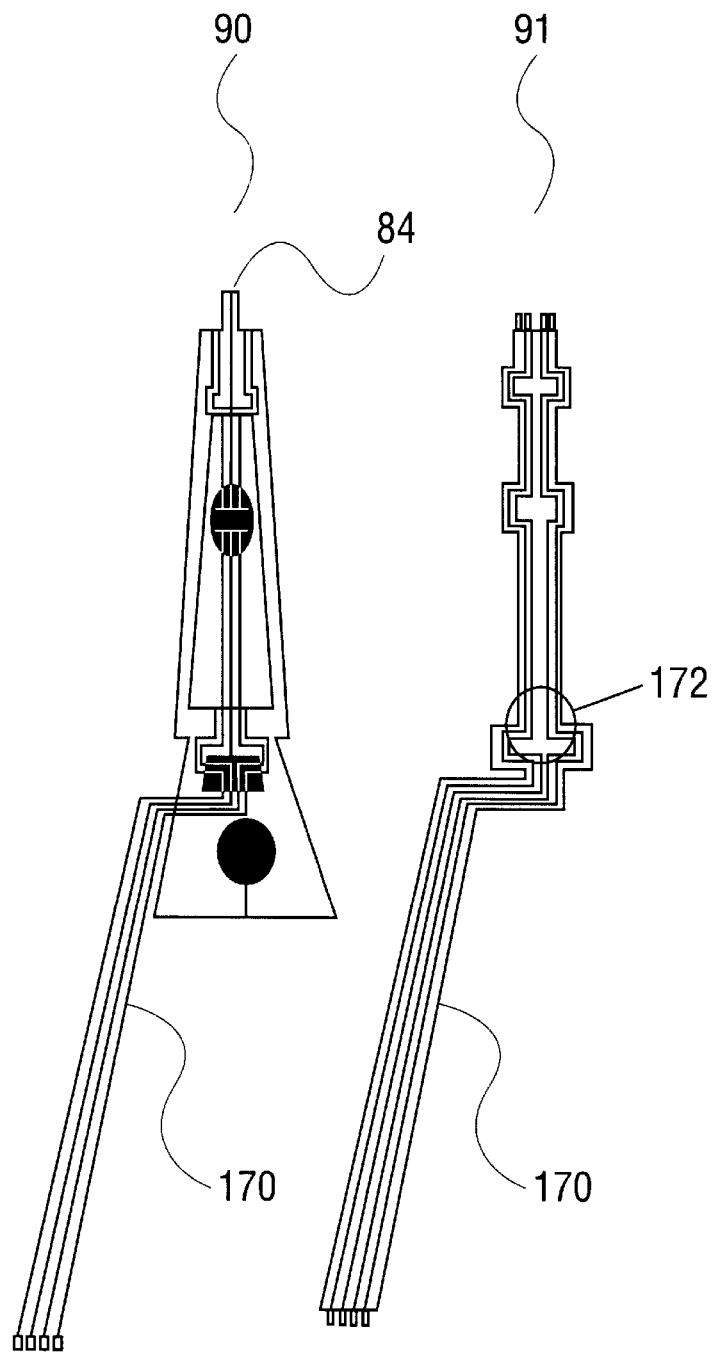
Fig. 4(a)  Fig. 4(b)  Fig. 4(c)

CONDUCTIVE COATING OF FLEXIBLE CIRCUITS FOR ILS TRANSMISSION LINES

FIELD OF THE INVENTION

This invention relates generally to computer disk drives. More specifically, the invention relates to a flexible cable used in integrated lead suspension for interconnecting a read-write head to electronic circuitry in the computer hard drive and a method for making such cable.

BACKGROUND OF THE INVENTION

Computer hard drives often use a flexible ribbon cable to carry signals to and from the read/write head. The cable generally comprises one or more conductors sandwiched between two layers of flexible insulating material. As the data transfer rate to and from the storage increases to the gigahertz range, the need for a durable and flexible cable carrying high frequency current with constant electrical characteristics also increases. Especially when the cable has to be twisted and bent to fit a specific physical geometry of a suspension assembly in a computer hard disk drive. Usually, the suspension assembly is made of different materials. When the flexible cable meets different materials underneath it, the characteristic impedance of the cable changes. As a result, the reflection coefficient of the flexible cable changes, creating losses and unwanted reflection at high frequency. In addition to the increase in the speed of computer's data retrieval to and from the storage, the size of computer and hard drive are also reduced as in lap top computers. In such situation, the flexible cable needs to fit snugly with the suspension assembly more than ever before. As the flexible cable is placed on the suspension assembly to carry information to and from the hard drive, it also has to be bent around sharps turns according to the physical geometry of each type of assembly. As a result, the characteristic impedance of the cable changes and unwanted reflection along the cable increases, making impedance matching even more challenging. Moreover, in a compact hard drive environment, the temperature may be very high, and the suspension assembly moves constantly to retrieve information, shortening the lifetime of the flexible cable. Furthermore, in high frequency application, electromagnetic interference (EMI) may distort the signals that go through the cable.

One prior art solution is to electrically ground the conductors on either side of sensitive signals. This design improves the signal quality at frequencies up to a few hundred Megahertz. However, the electromagnetic (EMI) problems still persist.

One prior art solution to the EMI problem is to coat the cable with a conductive paint to prevent the electromagnetic radiation from penetrating the cable. However, if the suspension assembly moves constantly and under high temperature, the conductive paint tends to crack. Thus, the flexible cable becomes unreliable and has to be changed regularly.

In 1989, the inventor of the present application proposed a solution to the above problems. He disclosed a flexible cable comprising of a parallel conductors disposed between two flexible insulating substrates. The two flexible insulating substrates were glued together. One of the flexible insulating substrate was punched with holes along its length to expose a center conductor. A layer of aluminum was sputter deposited over the surface of the cable, making electrical contact with the center conductor. The aluminum layer and the center conductor were electrically grounded to make the flexible cable behave as a shielded coaxial cable. Although the sputter coating solution solved the cracking problem of the conductive paint coating, the sputter deposited aluminum layer did not adhere to the polymer materials used in the insulating substrates. Therefore, a need existed in the art for a flexible cable having a strongly adhering conductive coating and a method for fabricating same.

OBJECTS AND ADVANTAGES

It is a principle objective of this invention is to make a flexible cable having a strongly adhering sputter deposited conductive layer. It is a further object to provide a flexible cable with a constant characteristic impedance $Z_0$. It is an additional object to provide flexible cable that can also be used in environments with varying geometry without any unwanted reflection or changes in its electrical characteristics, or with EMI problems. It is also an object of the present invention to provide a flexible cable with a sputter deposited conductive layer that can also sustain the heat and constant motion of the suspension assembly without cracking.

SUMMARY OF THE INVENTION

According to a first embodiment of the present invention, a flexible cable comprises one or more trace conductors sandwiched between two flexible insulating substrates. An outer surface of the cable is cleaned and sputter coated with a conductive coating. The conductive coating generally comprises a thin gold layer sputter deposited on the surface of the flexible substrates and an aluminum layer sputter deposited on top of the gold layer. The gold layer acts as a seed to improve the adhesion of the aluminum coating to the material of the flexible insulating substrates. The surface of the cable is then cleaned prior to depositing the coating by washing in an alcohol, such as isopropyl alcohol. This process allows the aluminum layer to be sputtered directly to the flexible substrate. The cable may also be cleaned by a glow discharge or sputter etching process. Either or both of the substrates may include one or more holes that expose one or more trace conductors. The conductive coating may therefore make electrical contact with the trace conductors via the holes. The trace conductors and/or the conductive coating may also be electrically grounded to provide shielding against electromagnetic interference. This cable maintains all the advantages of prior art and achieves durability and flexibility. In addition, the conductive coating on the flexible cable can successfully withstand heat and the constant motion without cracking or otherwise separating from the substrates.

BRIEF DESCRIPTION OF THE DRAWINGS

FIGS. 4(a)–4(c) illustrate a suspension assembly for hard drives that incorporates the flexible cable of the first embodiment;

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitation upon, the claimed invention.

Figure 1:
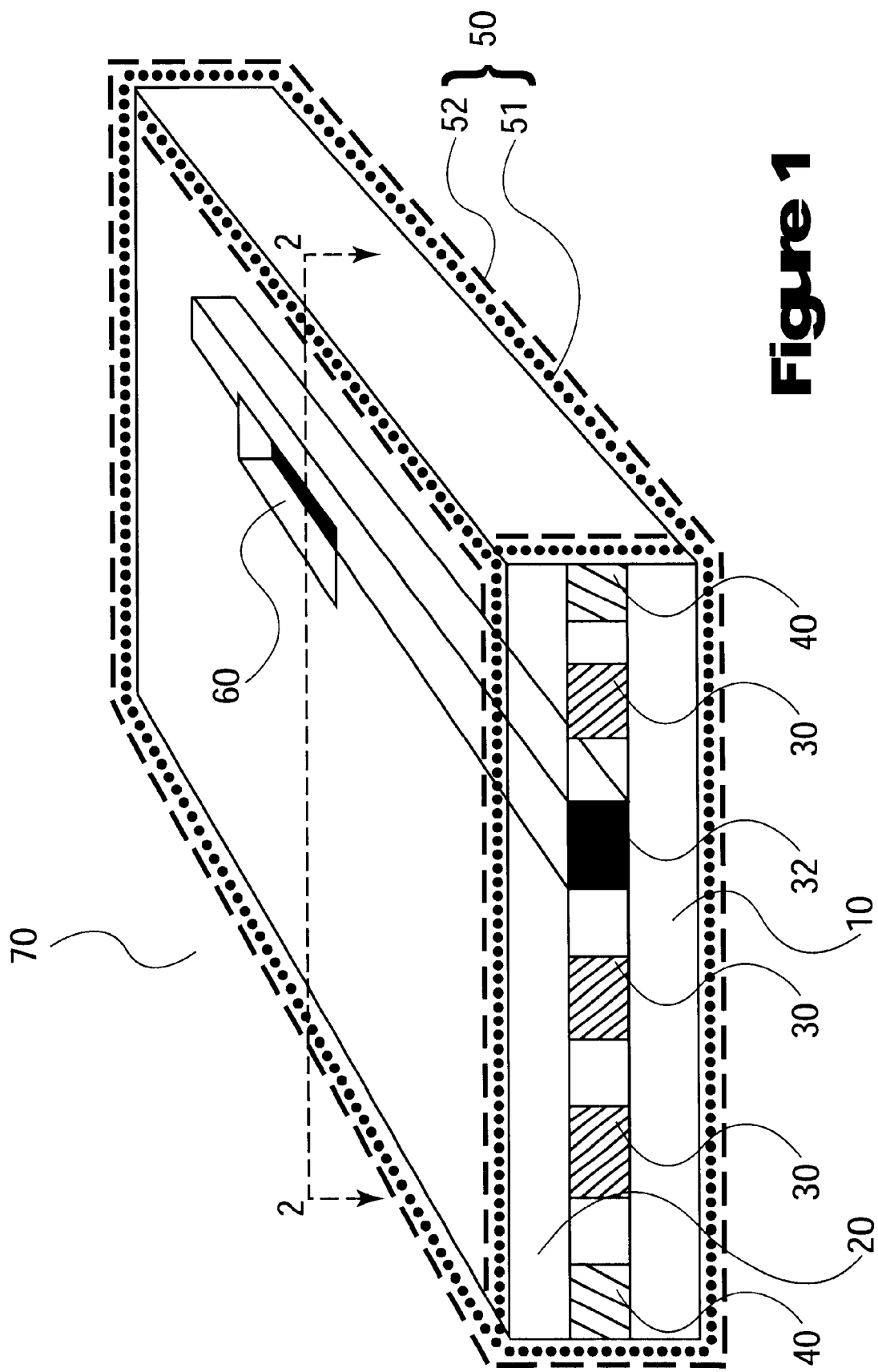
FIG. 1 illustrates a flexible cable with sputtered outer aluminum shield according to a first embodiment of the present invention.

Referring to FIG. 1, a flexible cable 70 includes one or more trace conductors 30 sandwiched between a first and a second flexible insulating substrate 10 and 20 respectively. The first and second substrates 10, 20 could be made from any polymer such as polyester, polyimide film, kapton, polycarbonate and the like. First flexible insulating substrate 10 and second flexible insulating substrate 20 are glued together, e.g., by a conductive glue 40. One of the flexible insulating substrates 10, 20 may be punched with holes 60 right above center conductors to expose these conductors. Cable 70 also includes a conductive coating 50 which comprises a thin gold layer 51 sputter deposited on the surface of substrates 10 and 20, and an aluminum layer 52 sputter deposited over gold layer 51.

First flexible insulating substrate 10 and second flexible insulating substrate 20 can be either polymer or any kind of flexible and durable electrical insulators that neither break nor deform under high stress and high temperature environment. The width and length of substrates 10 and 20 depend on specific application and the designer's specifications.

Trace conductors 30 could be formed by patterned etching a single sheet 31 of conductive material such copper, or any kind of flexible conductors that do not dissipate a lot of heat. Trace conductor 30 may be laminated between the flexible insulating substrates 10, 20. Conductive glue 40 may be used to secure two flexible insulating substrates 10 and 20 as is well known in the art. The flexible cable 70 may have any suitable thickness. In a particular embodiment, the flexible cable 70 is between about 0.07 mm and about 0.09 mm thick. The conductive sheet 31 is typically made of copper about 0.0178 mm thick. The flexible insulating substrates are typically made of Kapton between 0.0261 mm and 0.0361 mm thick.

Figure 6:
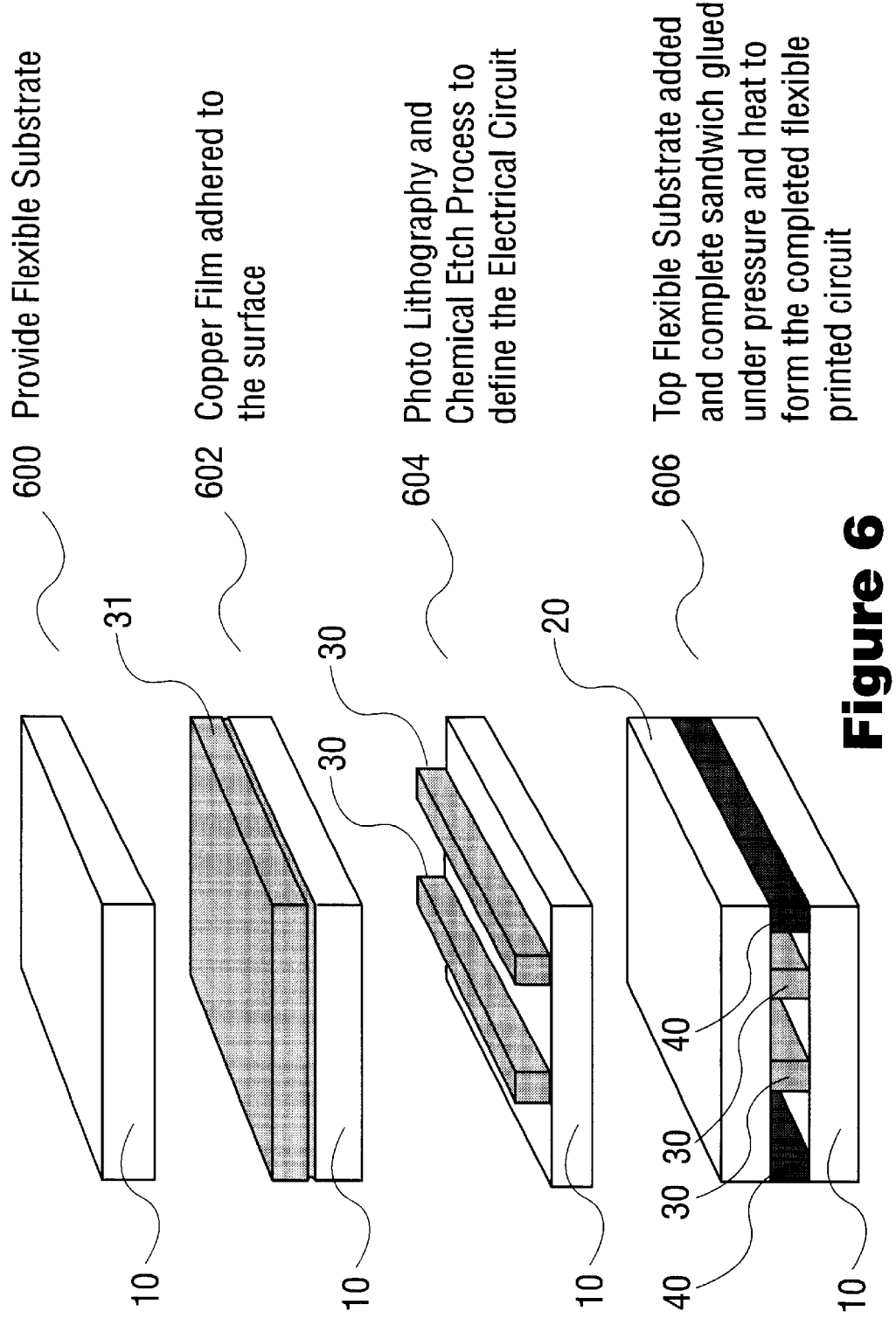
FIG. 6 illustrates a flexible cable manufacturing process.

FIG. 6 further shows how to make flexible cable 70 in four steps. At 600, a insulating flexible substrate, such as first insulating substrate 10, is provided. At 602, a copper film is adhered to the surface of the first insulating substrate 10. At 604, the electrical trace conductors 30 are defined, e.g. using a photolithography and chemical etch process. At 606, a second flexible insulating substrate 20 is added on top of the electrical trace conductors 30, and the two substrates 10 and 20 are glued together under pressure and heat to form flexible cable 70. Either or both of the substrates 10 and 20 may be punched with holes 60 that are positioned to expose one or more of the conductors 30 for grounding. In a preferred embodiment the grounded conductor, e.g. conductor 32 lies between two other (non-grounded) conductors.

After manufacturing flexible cable 70, a conductive coating 50 is formed on the substrates 10, 20 to electrically shield electrical trace conductors 30. Conductive coating 50 generally comprises a layer of gold 51 sputter deposited on top of the surface of cable 70, and a layer of aluminum 52 of 25 angstroms thickness or greater sputter deposited over on top of the thin layer of gold 51. The thickness of the aluminum layer 52 is related to the frequency of signals carried by the flexible cable 70. Generally the higher the frequency, the thinner the aluminum layer 52. For example, an aluminum layer 52 approximately 25 Angstroms thick is typically used for signals of order 1 GHz. For 100 MHz signals an aluminum coating 100–200 Angstroms thick may be used although there may be some loss of flexibility in the cable 70.

Gold layer 51 strongly adheres to polymer substrates such as kapton. Gold layer 51 thus acts as glue that holds aluminum layer 52 in place. Gold layer 51 is usually thinner than aluminum layer 52. For example, gold layer 51 may be about 5–15 Angstroms thick and aluminum layer 52 is typically about 100 angstroms thick. Gold layer 51 is preferably sufficiently thin that it has an open lattice so that aluminum layer 52 can easily attach. Conductive coating 50 makes electrical contact with one or more of conductors 30 via holes 60. When cable 70 is installed in a suspension assembly in a computer hard drive, conductive coating 50 and one or more of the conductive traces 30 may be electrically grounded to the system ground. If the grounded trace makes electrical contact with the conductive coating 50, the coating 50 will also be grounded.

Figure 3:
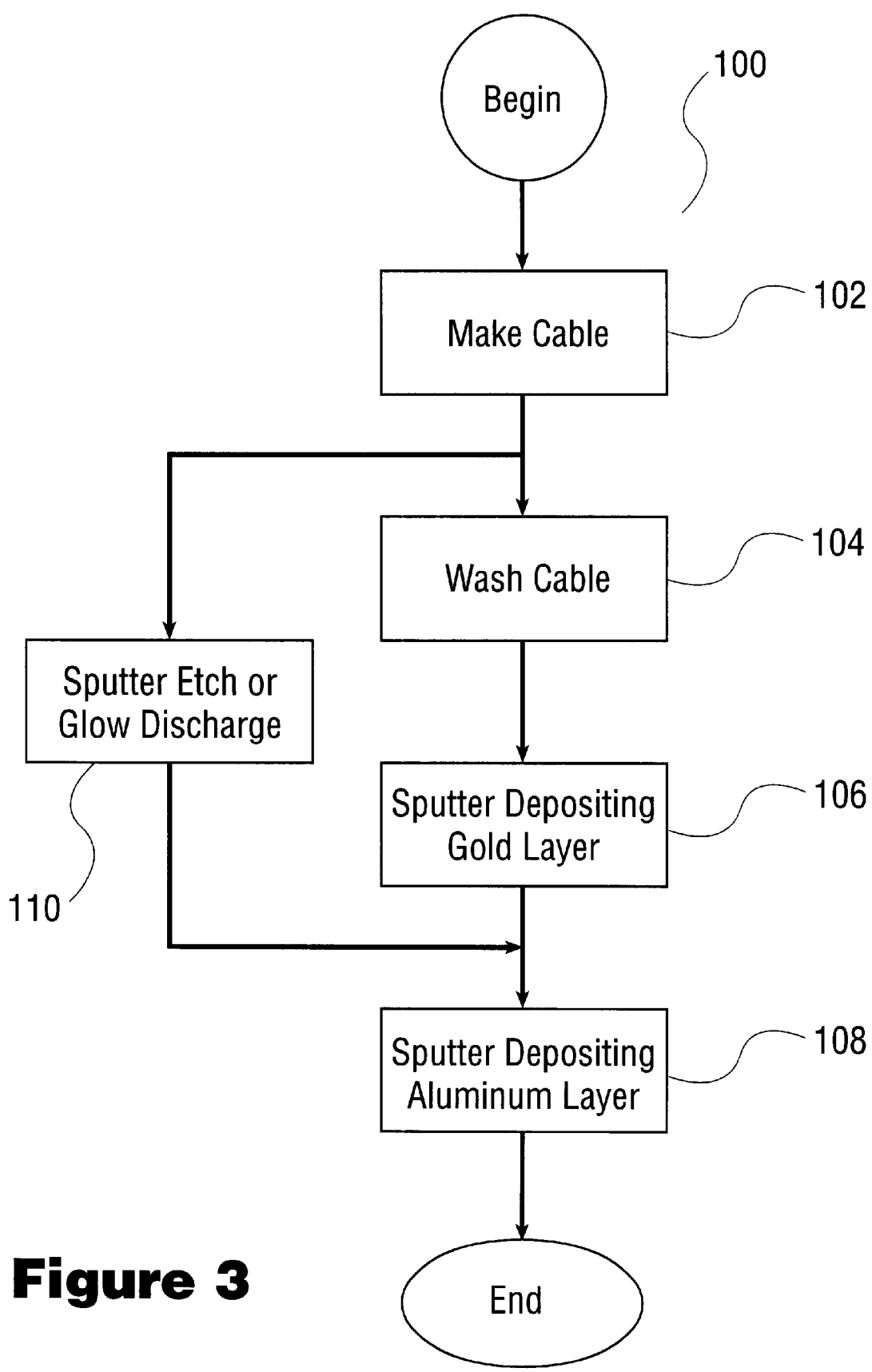
FIG. 3 illustrates a flow chart of a method of making flexible cable according to a second embodiment of the present invention.

Referring to FIG. 3. The steps of making cable 70 and conductive coating 50 are described in a flow diagram 100. At step 102, a thin sheet of conductor is disposed on top of a flexible insulating substrate 10 to produce one or more trace conductors 30. Trace conductors 30 may be formed by any methods of etching parallel printed circuits. These etching methods are common in the pertinent art. Suitable methods include plasma etching and wet chemical etching. Wet chemical acid etch is more common in the pertinent art, but plasma etch is more accurate for high aspect ratio features. If the aspect ratio is low, i.e. the width of the space between the conductors 30 is large compared to the thickness of the conductors 30, a wet chemical process may be used. But other etching techniques, such as plasma etching, could also be used. In a plasma etching process, ions from a plasma gas toward a conductor sheet 31 used to form the electrical traces 30. Because the ions are accelerated, they preferentially etch the conductor sheet 31 in a direction substantially parallel that of the electric field.

Figure 2:
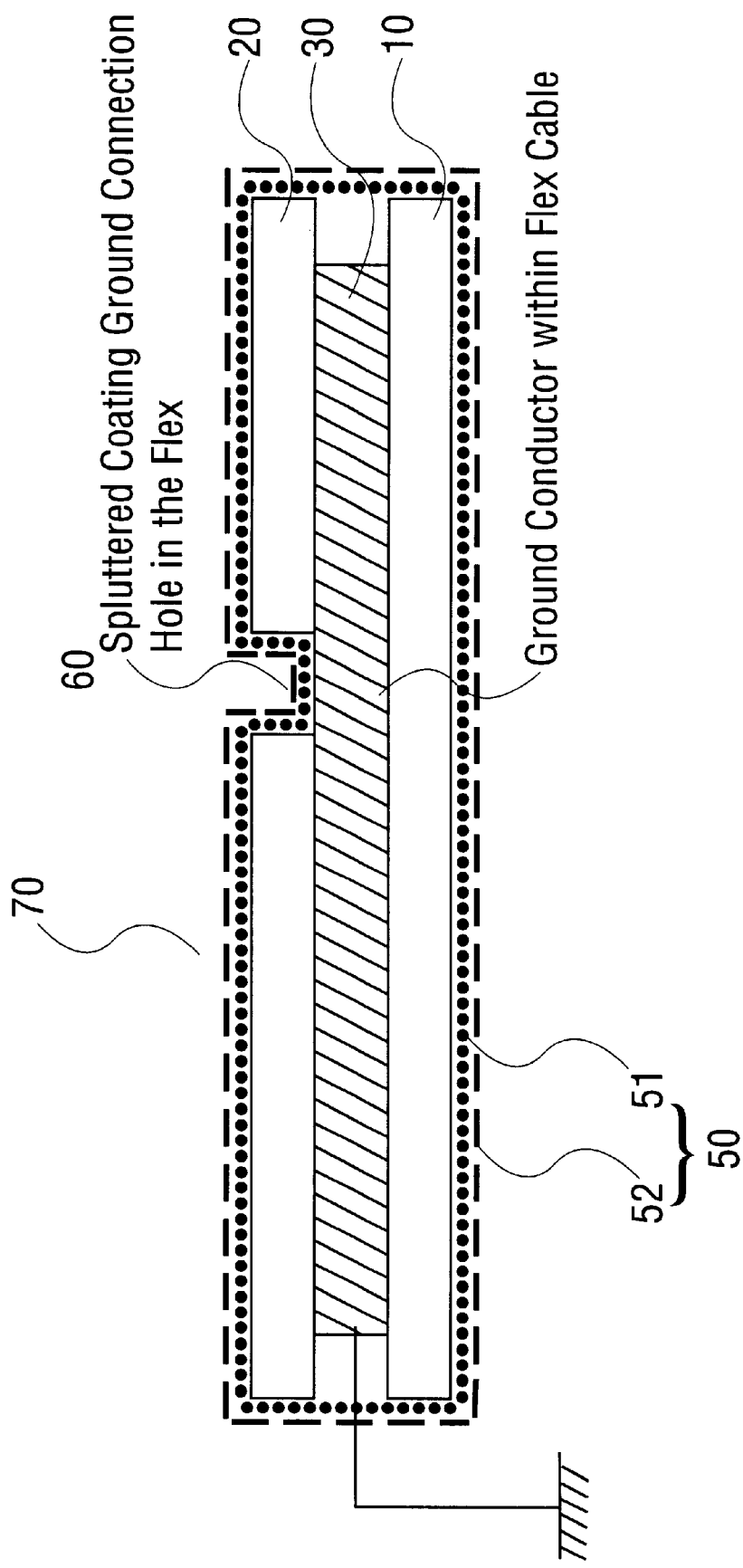
FIG. 2 illustrates a cross-sectional view of the flexible cable FIG. 1 taken along line 2—2 of FIG. 1.

The pattern on conductor sheet 31 could be parallel traces of copper or it could be silicon. Any of the middle traces except the two outermost traces can be electrically grounded later. A series of holes 60 may be punched along the longitudinal axis of cable 70 to expose the center conductors of trace conductors 30. See FIG. 1 and FIG. 2. Another flexible substrate, such as the second flexible insulating substrate 20 is laid over the trace conductors 30. First flexible insulating substrate 20 and second flexible insulating substrate 10 may be glued together on the sides by a conductive glue 40. See FIG. 1 and FIG. 2.

At step 104, after flexible cable 70 is made, the surfaces of flexible insulating substrates 20 and 30 are cleaned to facilitate the adhesion of conductive coating 50. One way to clean cable 70 is by sputter etching to remove all surface contamination. Alternatively, cable 70 may be washed with isoprophyl alcohol in an ultrasonic cleaner, preferably set at 35 degrees C., for about one minute, to remove all surface contamination and release all agents used during the manufacturing of the cable 70. Washing step 104 may also include or sputter etching or glow discharge cleaning to clean the surface of cable 70 of the impurities and to prepare for better adhesion of conductive coating 50, as shown at step 110. Glow discharge/sputter cleaning step 110 may be part of washing step 104 or a separate step. Furthermore, glow discharge/sputter cleaning step 110 may be implemented between the two sputter deposition steps 106, 108, e.g. to clean the gold layer 51 prior to depositing the aluminum layer 52.

Sputter etching is the name conventionally given to the process of removal of material from a surface by sputter ejection. The sputtering process essentially involves knocking an atom out of the surface of a target due to ion bombardment. Sputter etching can be carried out in a conventional sputtering system with a glow discharge, or with an externally generated ion beam.

Glow discharge cleaning involves placing cable 70 to be cleaned in a glow discharge so that it is bombarded by low energy ions and electrons. Beneficial effects can result from this technique, particularly if the cleaning is carried out in an oxygen discharge. Impurities may be desorbed from the two sides of cable 70 due the ion and electron bombardment, or due to the heating associated with these bombardments. In an oxygen discharge, there will also be effective oxidation of organic impurities on the surface by atomic oxygen formed dissociatively in the discharge. These oxides will generally be volatile and therefore easily removed. The same glow discharge process is also used for treating certain polymeric materials prior to subsequent processing, e.g. before deposition of a coating onto a polymer.

Referring again to FIG. 3, at step 106, after being washed, flexible cable 70 then receives a gold flash coating 51 of approximately 10 angstrom thickness to provide better adhesion for the aluminum layer and to reduce particle shedding. In a sputter coating process the cable 70 and a target made of the coating material are placed in a glow discharge chamber. Plasma is formed in the chamber, e.g. using an inert gas such as Argon. The plasma is biased such that ions from the plasma bombard the target, knocking of atoms from the surface of the target. These atoms then are deposited on the surface of the cable forming the gold coating 51. Alternatively the gold coating 51 may be formed by thermal evaporation, chemical vapor deposition (CVD) metalloorganic chemical vapor deposition (MOCVD) or other suitable coating techniques.

Finally, at step 108, cable 70 is sputter coated with aluminum layer 52. Aluminum layer 52 typically has a thickness of more than 100 angstroms. The sputter deposition of aluminum layer 52 is similar to the gold flashing process above. Gold and aluminum sputtered layers 51, 52 make up conductive coating 50 that provides extra adhesion and durability to the surface of insulating substrates 10 and 20.

ALTERNATIVE EMBODIMENTS

Other embodiments of this invention are possible, depending on the specific application. For example, flexible cables such as cable 70 described above, may be incorporated into a suspension arm assembly for a disk drive system as shown in FIGS. 4(a). Three different levels of assembly commonly known in the art such as an actuator arm 80, a head suspension 90, and integrated head lead suspension wiring (ILS or TSA) 91 are shown. Actuator arm 80 provides structural support for the head suspension 90. Actuator arm 80 is typically made from a durable and light metal such as aluminum. The head suspension 90, depicted in close-up in FIG. 4(b) includes a read/write head 84 and the integrated head lead suspension 91. The read/write head 84 may be of any type including giant magneto resistance (GMR) heads, inductive heads, and the like. The read/write head 84 senses changes in the magnetic properties of a recording medium and converts the change into an electrical signal. The integrated head lead suspension 91, depicted in close-up in FIG. 4(c), provides electrical connection between the read write head 84 and drive electronics (not shown) The integrated head lead suspension wiring includes a cable 170 having features in common with the cable 70 described above. Specifically, the cables 170 include one or more conductive traces sandwiched between first and second flexible insulating substrates. The cables 170 include a sputter deposited conductive coating that acts as an electrical shield. The conductive coating may be electrically grounded to one or more of the conductive traces in the cable. The conductive coating may be deposited in accordance with the method described above with respect to FIG. 3. The cable 170 may include one or more changes in topology 172. The conductive coating and/or grounding of one or more traces reduces unwanted reflections due to changes in impedance from such changes in topology.

Figure 5:
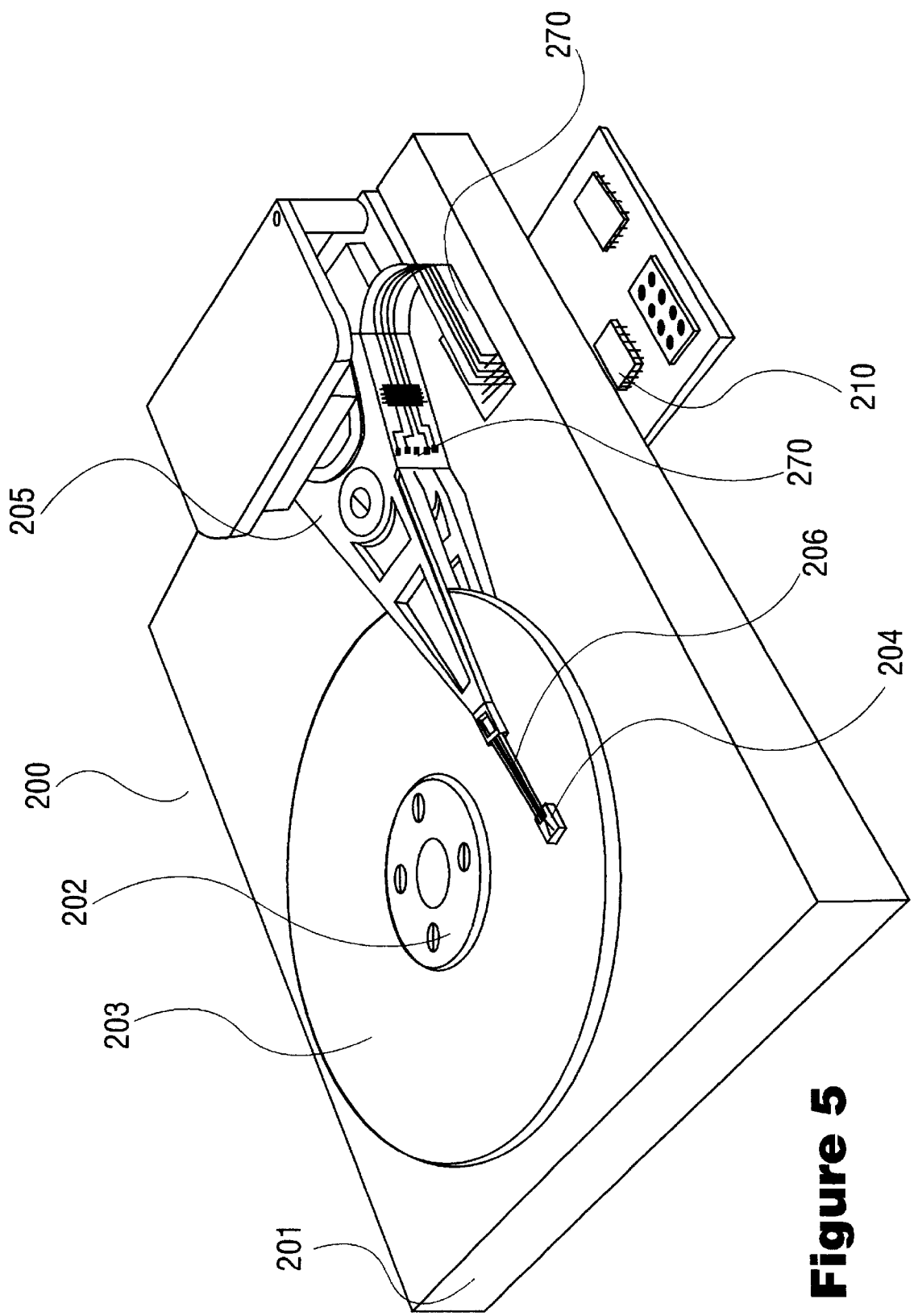
FIG. 5 illustrates a simplified schematic diagram of a typical disk drive system according to an alternative embodiment of the present invention.

Those skilled in the art will also recognize that the flexible cable and the method of the present invention can be employed in many other applications, where there is a need for a flexible conductor. Cable 70 and the suspension assemblies described above may be incorporated into a typical disk drive system 200, commonly known in the art, as shown in FIG. 5. The disk drive system 200 generally comprises a magnetic recording disk 203, a motor 201 connected to the disk 203, a read/write head 204, an actuator arm 205, a read/write head suspension 206, drive electronics 210, and a cable 270 electrically coupled to the drive electronics 210 and the read/write head 204. A clamp 202 connects the disk 203 to the motor 201. The motor rotates the disk 203 with respect to the read/write head 204. The actuator 205 moves the read/write head 204 across the magnetic recording disk 203 so the read/write head 204 may access different regions of magnetically recorded data on the magnetic recording disk 203. The read write head 204 senses changes in the magnetic properties of a recording medium of disk 203 and converts the change into an electrical signal. The read/write head 204 may be of the same or a similar type to read/write head 84 described above. The cable 270 transmits electrical signals between the read/write head 204 and the drive electronics 210. The motor 202 spins the disk 203 with respect to read/write head 204. The cable 270 has features in common with the cable 70 described above. Specifically, the cable 270 includes one or more conductive traces sandwiched between first and second flexible insulating substrates. The cable 270 includes a sputter deposited conductive coating that acts as an electrical shield. The conductive coating may be electrically grounded to one or more of the conductive traces in the cable. The conductive coating may be deposited in accordance with the method described above with respect to FIG. 3.

Although the present invention and its advantages have been described in detail, it should be understood that various changes, substitutions, and alternations can be made herein without departing from the principle and the scope of the invention. Accordingly, the scope of the present invention should be determined by the following claims and their legal equivalents.

What is claimed is:

1. An integrated lead suspension cable comprising:
   (a) a first flexible insulating substrate;
   (b) a second flexible insulating substrate;
   (c) one or more trace conductors disposed between said first flexible substrate and said second flexible insulating substrate; wherein either or both of said first and second flexible insulating substrates having one or more holes that expose said one or more trace conductors; and (d) a conductive coating disposed over a surface of said first flexible insulating substrate and said second flexible insulating substrate; wherein said conductive coating comprises a layer of aluminum sputter deposited over a layer of gold and wherein said one or more holes provide electrical contact between said conductive coating and said one or more trace conductors.

2. The cable as in claim 1, wherein said first flexible insulating substrate is secured to said second flexible insulating substrate by glue.

3. The cable as in claim 1, wherein said first flexible insulating substrate has one or more holes placed along its length.

4. The cable as in claim 3, wherein said holes provide electrical contact between said conductive coating and a central center of said trace conductors.

5. The cable as in claim 1, wherein said conductive coating is connected to an electrical ground.

6. The cable as in claim 1, wherein said layer of aluminum is greater than about 25 angstroms in thickness.

7. The cable as in claim 1, wherein said layer of gold is between about 5 angstroms and 15 angstroms in thickness.

8. An integrated lead suspension comprising:
   (a) a suspension arm;
   (b) a read/write head attached to the suspension arm; and
   (c) a flexible cable, electrically coupled to the read/write head, wherein the cable comprises:
      i) a first flexible insulating substrate;
      ii) a second flexible insulating substrate;
      iii) one or more trace conductors disposed between said first flexible substrate and said second flexible insulating substrate; wherein either or both of said first and second flexible insulating substrates having one or more holes that expose said one or more trace conductors; and
      iv) a conductive coating disposed over a surface of said first flexible insulating substrate and said second flexible insulating substrate; wherein said conductive coating comprises a layer of aluminum sputter deposited over a layer of gold and wherein said one or more holes provide electrical contact between said conductive coating and said one or more trace conductors.

9. A disk drive system comprising:
   (a) a disk containing a magnetic recording medium;
   (b) a suspension arm;
   (c) a read/write head attached to the suspension arm, the read/write head being disposed proximate the disk;
   (d) means for moving the suspension arm whereby the read/write head moves with respect to a surface of the disk;
   (e) a motor coupled to the disk; and
   (f) a flexible cable, electrically coupled to the read/write head, wherein the cable comprises:
      i) a first flexible insulating substrate;
      ii) a second flexible insulating substrate;
      iii) one or more trace conductors disposed between said first flexible substrate and said second flexible insulating substrate; wherein either or both of said first and second flexible insulating substrates having one or more holes that expose said one or more trace conductors; and
      iv) a conductive coating disposed over a surface of said first flexible insulating substrate and said second flexible insulating substrate; wherein said conductive coating comprises a layer of aluminum sputter deposited over a layer of gold and wherein said one or more holes provide electrical contact between said conductive coating and said one or more trace conductors.

\* \* \* \* \*